US006469934B2

(12) United States Patent
de Sandre et al.

(10) Patent No.: US 6,469,934 B2
(45) Date of Patent: Oct. 22, 2002

(54) SOFT PROGRAMMING METHOD FOR NON-VOLATILE MEMORY CELLS

(75) Inventors: Guido de Sandre, Brugherio; Marco Pasotti, S. Martino Siccomario; Pier Luigi Rolandi, Monleale, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/738,253

(22) Filed: Dec. 14, 2000

(65) Prior Publication Data

US 2001/0055225 A1 Dec. 27, 2001

(30) Foreign Application Priority Data

Dec. 14, 1999  (IT) .......................................... TO99A1098

(51) Int. Cl.[7] .............................................. G11C 16/04
(52) U.S. Cl. .......................... 365/185.18; 365/185.19; 365/185.13; 365/185.33
(58) Field of Search ....................... 365/185.18, 185.13, 365/185.19, 185.33

(56) References Cited

U.S. PATENT DOCUMENTS 5,663,923 A * 9/1997 Baltar et al. ........... 365/230.03
5,721,707 A * 2/1998 Villa et al. .................. 365/218
5,889,699 A * 3/1999 Takano ................... 365/185.18
5,912,845 A * 6/1999 Chen et al. ............... 365/185.3
5,999,456 A * 12/1999 Sali et al. ............... 365/185.28
6,166,956 A * 12/2000 Yiu et al. ............... 365/185.19
6,234,298 B1 * 5/2001 Lee et al. ............... 365/185.28
6,288,938 B1 * 9/2001 Park et al. ............. 365/185.08
6,324,101 B1 * 11/2001 Miyawaki .............. 365/185.28

FOREIGN PATENT DOCUMENTS

WO        WO 97/19452        5/1997

* cited by examiner

*Primary Examiner*—Richard Elms
*Assistant Examiner*—Tuan T. Nguyen
(74) *Attorney, Agent, or Firm*—Lisa K. Jorgenson; David V. Carlson; Seed IP Law Group, PLLC

(57) ABSTRACT

The optimized soft programming method is used in a memory consisting of a plurality of cells that are grouped into sectors. The cells that belong to a single sector have gate terminals connected to a plurality of word lines, and drain terminals connected to a plurality of local bit lines. The soft programming method consists of selecting at least one local bit line in the sector, and simultaneously selecting all the word lines in the same sector. A corresponding gate voltage is applied to all the word lines, whereas a constant drain voltage, with a pre-determined value is applied to the local bit line.

20 Claims, 2 Drawing Sheets

SOFT PROGRAMMING METHOD FOR NON-VOLATILE MEMORY CELLS

TECHNICAL FIELD

The present invention relates to an optimized soft programming method for flash EEPROM type non-volatile memory cells.

BACKGROUND OF THE INVENTION

As is known, the erasing operation of flash cells takes place by Fowler-Nordheim tunneling, and is carried out by increasing, for a pre-determined time, which is subdivided into one or more erasing pulses, the potential of the bulk regions (bulk erasing), or the potential of the source regions (source erasing) of these cells, as described in R. Bez, D. Cantarelli, G. Ortolani, G. Servalli, C. Villa and M. Dallabora: "A New Erasing Method for a Single-Voltage Long-Endurance Flash Memory," *IEEE Electron Devices Letters*, Vol. 19, No. 2, February 1998. Since, in NOR type memory architectures, the flash cells belonging to a single memory sector have in common the bulk regions and the source regions, the erasing operation is carried out in parallel on all the flash cells belonging to a single memory sector.

In detail, the bulk erasing operation takes place by supplying one or more erasing pulses of a pre-determined duration, to the cells of an addressed sector. More specifically, for a pre-determined time the bulk region that is common to all the cells in the addressed sector is supplied with a voltage $V_B$ which increases in a non-linear manner, starting from a minimum potential equivalent to 0V, up to a maximum potential equivalent to 8V (FIG. 1).

Simultaneously, all the word lines connected to the gate terminals of the cells in the sector addressed are biased to a negative voltage (−8V), whereas all the bit lines connected to the drain terminals of the same cells, and the source terminals, are left floating.

By this means, below the floating gate regions of the cells in the sector addressed, there is created a transverse electrical field with an intensity such as to permit extraction of the electrons which have remained trapped in this floating gate region, after a preceding programming operation. The threshold voltage of these cells is consequently decreased to a pre-determined threshold value.

One of the problems which is encountered most frequently in erasing of memory cells is that after application of the erasing pulses, some memory cells are erased excessively, until a threshold voltage which is too low, or even negative, is obtained. These cells are therefore in a conductive state, even though their respective word lines are biased to ground (depleted cells).

It is known that in a non-volatile memory which has a NOR type configuration, the presence of depleted cells can distort the subsequent reading operation of the memory itself. It is therefore necessary In memories of this type, to follow the erasing operation with a soft programming operation of the depleted cells.

According to a first known solution, this soft programming operation consists of supplying, to a previously addressed cell, one or more soft programming pulses with a pre-determined duration, each of which is followed by a phase of checking the soft programming of the cell itself, similar to the normal programming phase.

Although this first known solution has the advantage of being selective in the soft programming of each individual cell, it has the disadvantage of having to be carried out before the condition of depletion is completely established in the cells that are not addressed. In fact, the efficiency of soft programming of the cell addressed decreases significantly if there are various depleted cells, since in this case, part of the charge that is supplied for soft programming of the cell addressed is lost through the effect of the other depleted cells.

In addition, the erasing algorithm obtained by means of this first known solution is very slow and complex, since the soft programming operation must be carried out on each individual cell.

According to another known solution, the soft programming operation consists of biasing a pre-selected group of cells (hereinafter defined as pre-selected cells) belonging to a memory sector previously erased, such as to produce in these cells an increase in the threshold voltage to above a pre-determined soft programming value, thus eliminating the condition of depletion.

For this purpose, for a pre-determined time, a ramp voltage is applied to the word lines connected to the gate terminals of the pre-selected cells, whereas the remaining word lines in the sector are set to a negative potential which is equivalent to −2V.

Simultaneously, a constant positive potential is applied to the bit lines connected to the drain terminals of the pre-selected cells.

On the other hand, the source terminals and the common bulk region are connected respectively to ground and to a constant negative potential.

Since this known solution uses a high level of parallelism in soft programming of the cells, it has the advantage that it makes the erasing algorithm faster and simpler than the known solution previously described. However, its implementation requires somewhat complex row decoding, and negative voltage generators in order to generate the negative voltage to be applied to the word lines which are not addressed.

In addition, the known solutions previously described do not exclude the possibility that, once the phase of erasing of the addressed sector has been completed, and the corresponding biasing voltages have been applied in order to carry out the soft programming of the same sector, some cells in the sector may still be depleted, partly owing to the variability of behavior of the individual cells.

In this case, the use of the current supplied to the bit lines addressed is not optimal. In fact, if depleted cells are also connected to these bit lines, in addition to the pre-selected cells, part of the current which is available on the bit lines flows into the depleted cells, without however affecting their threshold voltage. This current is therefore wasted for the purposes of soft programming of the cell or of the group of pre-selected cells, thus decreasing the efficiency of soft programming.

SUMMARY OF THE INVENTION

According to the present invention, an optimized soft programming method is provided for non-volatile memory cells. This method is used in a memory having a plurality of cells that are grouped into sectors. The cells that belong to a single sector have gate terminals connected to a plurality of word lines, and drain terminals connected to a plurality of local bit lines. The soft programming method is carried out by selecting at least one local bit line in the sector, and simultaneously selecting all the word lines in the same sector. A corresponding gate voltage is applied to all the word lines, whereas a constant drain voltage, with a pre-determined value is applied to the local bit line.

BRIEF DESCRIPTION OF THE DRAWINGS

The characteristics and advantages of the method according to the invention will become apparent from the following description of an embodiment provided by way of indicative, non-limiting example, with reference to the attached drawings, in which.

DETAILED DESCRIPTION OF THE INVENTION

Figure 2:
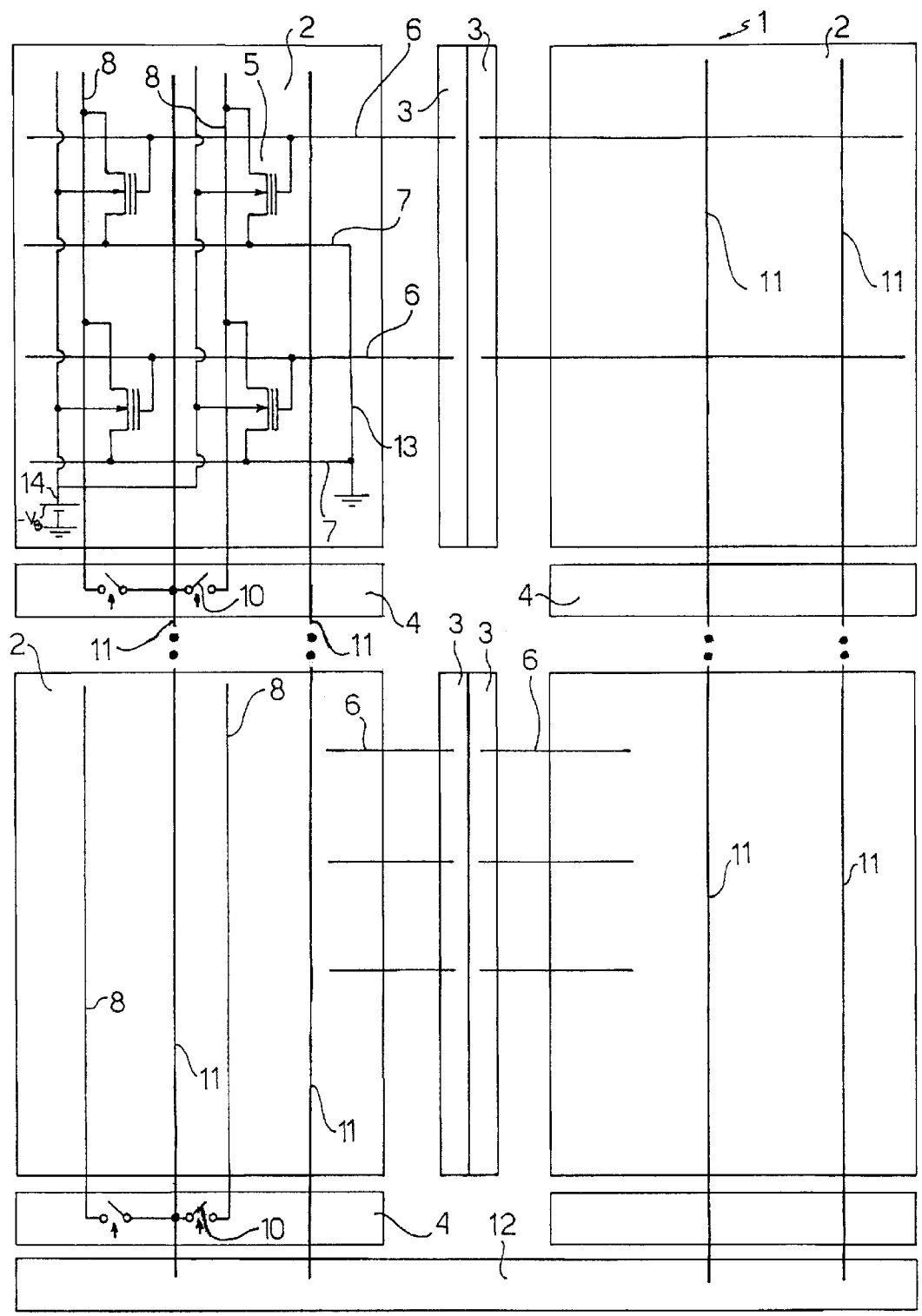
FIG. 2 shows a simplified electrical diagram of a non-volatile memory according to the invention.

With reference to FIG. 2, the soft programming method according to the invention is used in a flash type non-volatile memory 1, having a plurality of sectors 2, which, for example, are disposed on several rows and two columns, and are separated from one another by two pairs of global row decoders 3, respectively for the right-hand and left-hand sectors. A respective local column decoder 4 is disposed beneath each sector 2.

Each sector 2 comprises a plurality of cells 5, which are shown partially, only for one sector 2, and in turn are disposed on rows and columns.

In detail, the cells 5 which are disposed on a single row, and belong to a single sector 2, have gate terminals which are connected to a single word line 6, which in turn is connected to the global row decoder 3, and source terminals which are connected to a single source line 7, parallel to the word line 6; the cells 5 which are disposed on a single column, and belong to the same sector 2, have drain terminals which are connected to a single local bit line 8, which in turn is connected to the respective local column decoder 4. Adjacent pairs of local bit lines 8, belonging to a single sector 2, are connected via respective switches 10, which for example are formed by pass transistors, to a single global bit line 11, which extends along the entire respective column of sectors 2, and is connected to a global column decoder 12. All of the source lines 7 belonging to a single sector 2 are connected to one another, and are available outside the sector 2 by means of a common source line 13, and all the bulk regions of the cells 5 belonging to a single sector 2 are connected to one another, and are available outside the sector 2 by means of a common bulk line 14.

The global row decoder 3, the local column decoders 4 and the global column decoder 12 address in a known manner the word lines 6 and the local bit lines 8 and global bit lines 11 which are connected to the latter.

Figure 1:
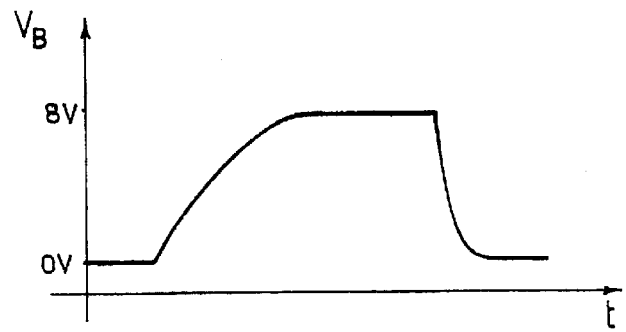
FIG. 1 shows the development of an electrical value used in the erasing phase of a known non-volatile memory.
Figure 3A:
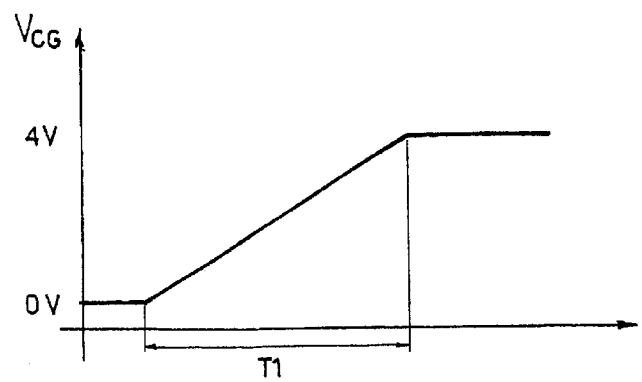
FIGS. 3a and 3b show the development of electrical values used in order to implement the method for soft programming of the memory in FIG. 2, according to the invention.
Figure 3B:
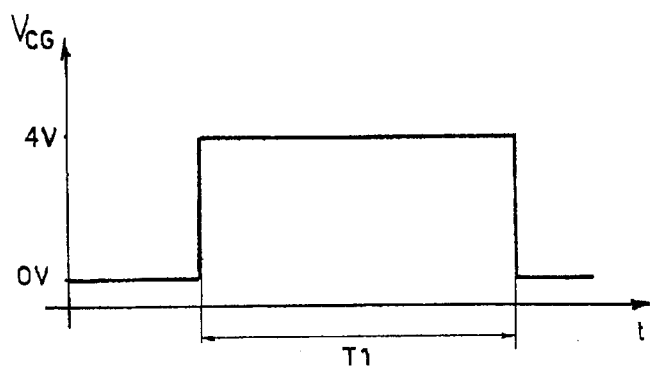

With reference to FIGS. 3A and 3B and to the electrical diagram shown in FIG. 2, the soft programming method according to the invention is carried out by addressing a local bit line 8 in a sector 2, by means of the respective local column decoder 4, and of addressing simultaneously all the word lines 6 belonging to the same sector 2, by means of the global row decoder 3. In addition, a pre-determined potential must be applied to the local bit line 8 addressed, and the current necessary in order to soft program at least all the cells connected to this local bit line 8 must be available to the latter.

In detail, for a pre-determined time T1, which for example is equivalent to 200–400 $\mu$s, all the word lines 6 in the sector 2 are supplied with a gate voltage $V_{CG}$, which is in the form of a ramp which rises in a linear manner from a lower value, which for example is between −1V and 0V, to a higher value, which for example is equivalent to 4V (FIG. 3A), and is such as to guarantee that none of the cells 5 reaches a threshold voltage which is higher than a pre-determined maximum threshold value.

As an alternative, the word lines 6 are supplied with a gate voltage $V_{CG}$ which defines a rectangular pulse, with an amplitude which for example is equivalent to approximately 4V, and a duration which is equivalent to T1 (FIG. 3B), or which defines a sequence of shorter pulses.

Simultaneously, by means of the local column decoder 4, a positive potential, which for example is equivalent to approximately 4.5 V, is applied to the local bit line 8.

On the other hand, the common source line 13 is biased to ground (0V), whereas the common bulk line 14 is supplied with a negative potential, which for example is equivalent to approximately −1V.

By this means, all of the current available on the local bit line 8 addressed is used for soft programming of the cells 5 which are connected to it, i.e., all of the current which flows in the local bit line 8 addressed is useful for the purposes of soft programming of the cells 5 which are connected to it, irrespective of the initial value of the threshold voltages of the cells themselves. In particular, the soft programming current flows in a greater proportion in the cells 5 which have a lower threshold voltage (depleted cells), thus increasing their threshold value, and flows in a lesser proportion in the cells 5 which have a higher threshold voltage, and which therefore need a lower current in order to be soft programmed. By this means there is an increase in the efficiency of soft programming.

In addition, the soft programming method according to the invention does not place any limitation on addressing and soft programming several local bit lines in parallel, on the basis of the existing current capacity, thus decreasing the time of execution of the erasing algorithm in comparison with that which is known.

By means of the soft programming method according to the invention, it is thus possible to obtain a compromise between a minimum time of execution of the erasing algorithm, and maximum current absorbed during the soft programming.

Finally, it is apparent that many modifications and variants can be made to the soft programming method described and illustrated here, all of which come within the scope of the inventive concept, as defined in the attached claims.

For example when the memory 1 is embedded in other electronic devices, the local column decoder 4 can be configured from the exterior. In fact, in these applications, the structure of the memory 1 is defined a priori, and the current which is available in order to soft program the cells 5 depends on the type of device in which the memory 1 is embedded. It is therefore necessary for the local column decoder to be configured on each occasion from the exterior, i.e., it must be possible to address one or more bit lines from the exterior, on the basis of the current available on each occasion from the electronic device in which the memory 1 is embedded.

In addition, the memory cells can be of the two-level type (and store a single bit), or of the multi-level type (and store a plurality of bits).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. Soft programming method for a non-volatile memory comprising a plurality of cells which are grouped into a plurality of sectors, the cells belonging to a single sector having gate terminals connected to a plurality of word lines, which are connected to a global row decoder, and having drain terminals connected to a plurality of local bit lines, which are connected to a local column decoder, wherein said method comprises:
  selecting at least one of said local bit lines in said sector by means of said local column decoder;
  selecting said plurality of word lines of the sector by means of said global row decoder;
  selecting a source terminal selection circuit wherein source terminals of said cells are connected to a common source line;
  selecting a bulk region connection circuit wherein bulk regions of said cells are connected to a common bulk line of said plurality of cells of said sector;
  applying a first selected voltage potential to said common bulk line of said plurality of cells of said sector;
  applying a second selected voltage potential to said common source line;
  applying a gate voltage to said plurality of selected word lines; and
  applying a drain voltage to said at least one of said selected local bit lines.

2. Method according to claim 1, wherein said phase of applying a drain voltage consists of applying a positive potential with a pre-determined value.

3. Method according to claim 1, wherein said gate voltage is a ramp voltage.

4. Method according to claim 1, wherein said gate voltage is a rectangular pulse.

5. Method according to claim 1, wherein said gate voltage is a sequence of pulses.

6. Method according to claim 1, wherein said cells belonging to said single sector comprise source terminals connected to source lines, said source lines being connected to one another and to a common source line, and wherein said method comprises the phase of applying a reference potential to said common source line.

7. Method according to claim 1, wherein said cells belonging to said single sector comprise bulk regions connected to one another and to a common bulk line, and wherein said method comprises the phase of applying a negative potential with a pre-determined value to said common bulk line.

8. A method of programming a sector of a plurality of memory cells comprising:
  applying a first voltage level of between −5 and −1.5 volts to a bulk region of the sector of said plurality of memory cells;
  applying a second voltage level of ground potential to a source terminal of the sector of said plurality of memory cells;
  applying a third voltage level of between −1 and 4 volts to a gate terminal of the sector of said plurality of memory cells; and
  applying a fourth voltage level of between 4 and 5 volts to a drain terminal of the sector of said plurality of memory cells.

9. Method according to claim 8 wherein the step of applying the third voltage level comprises:
  Increasing the voltage applied to the gate terminal as a ramp voltage from a first value to a second value.

10. Method according to claim 8 wherein the step of applying the third voltage level comprises:
  applying a rectangular pulse from a first value to a second value.

11. Method according to claim 8 wherein the step of applying the third voltage level comprises:
  applying a series of pulses, alternating between a first value and a second value.

12. A memory device comprising:
  a plurality of memory cells, each of said cells having a gate terminal, a drain terminal, a source terminal and a bulk region; wherein said cells are arranged in rows and columns, with each row of cells comprising one of a plurality of word lines, and each column of cells comprising one of a plurality of bit lines, and wherein the cells of a given word line are connected via the gate terminals to a common conductor, and cells of a given bit line are connected via the drain terminals to a common conductor;
  a word line selection circuit wherein said plurality of word lines may be selected individually or in any combination simultaneously;
  a bit line selection circuit wherein said plurality of bit lines may be selected individually or in any combination simultaneously;
  a source terminal selection circuit wherein the source terminals of said cells are connected to a common source line;
  a bulk region connection circuit wherein the bulk regions of said cells are connected to a common bulk line;
  a single sector having said plurality of memory cells;
  a first voltage source circuit wherein a first selected voltage potential may be applied to said common bulk line;
  a second voltage source circuit wherein a second selected voltage potential may be applied to said common source line;
  a third voltage source circuit wherein a third selected voltage potential may be applied to one or more of said word lines; and
  fourth voltage source circuit wherein a fourth selected voltage potential may be applied to one or more of said bit lines.

13. The memory device of claim 12, wherein said first selected voltage potential is a negative voltage between −0.5 and −1.5 volts.

14. The memory device of claim 12, wherein said second selected voltage potential is at ground.

15. The memory device of claim 12, wherein said fourth selected voltage potential is a between 4 and 5 Volts.

16. The memory device of claim 12, wherein said third selected voltage potential is between −1 Volt and 4 Volts.

17. The memory device according to claim 16, wherein said third selected voltage potential has a duration of 200–400 μs.

18. The memory device according to claim 17, wherein said third selected voltage potential comprises a ramp voltage.

19. The memory device according to claim 17, wherein said third selected voltage potential comprises a rectangular pulse.

20. The memory device according to claim 17, wherein said third selected voltage potential comprises a series of shorter pulses.

* * * * *